United States Patent
Wung et al.

(10) Patent No.: US 7,286,357 B2
(45) Date of Patent: Oct. 23, 2007

(54) COMPUTER SYSTEM WITH COOLING DEVICE FOR CPU

(75) Inventors: Shih-Hsun Wung, Guangdong (CN); Chun-Chi Chen, Guangdong (CN); Bao-Chun Chen, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 45 days.

(21) Appl. No.: 11/164,534

(22) Filed: Nov. 29, 2005

(65) Prior Publication Data

US 2007/0121296 A1  May 31, 2007

(51) Int. Cl.
*H05K 7/20* (2006.01)

(52) U.S. Cl. .................. 361/700; 361/697; 361/695

(58) Field of Classification Search ............ 361/695, 361/697, 699, 700, 704, 707, 719; 174/15.1, 174/15.2, 16.1, 16.2; 165/80.3, 104.3, 80.4, 165/104.26; 257/706, 718, 719, 714, 715
See application file for complete search history.

(56) References Cited

U.S. PATENT DOCUMENTS

| 5,422,787 A | * | 6/1995 | Gourdine ................ 361/697 |
| 5,630,469 A | * | 5/1997 | Butterbaugh et al. ...... 165/80.3 |
| 6,411,511 B1 | | 6/2002 | Chen ..................... 361/697 |

* cited by examiner

*Primary Examiner*—Javaid H. Nasri
(74) *Attorney, Agent, or Firm*—Winston Hsu

(57) ABSTRACT

A computer system includes a casing, a motherboard, a CPU mounted on the motherboard and a cooling device. The casing includes a pair of parallel panels. Air inlets and air outlets are respectively defined in the parallel panels and oriented toward each other. The motherboard is parallelly positioned between the parallel panels. The cooling device has a base portion contacting the CPU, a heat dissipation portion defining a plurality of channels communicating with the air outlets, at least one heat pipe thermally connecting the heat dissipation portion to the base portion, and a fan communicating with the air inlets and the channels.

18 Claims, 3 Drawing Sheets

COMPUTER SYSTEM WITH COOLING DEVICE FOR CPU

FIELD OF THE INVENTION

The present invention relates generally to a computer system, and more particularly to a computer system having an improved airflow path to accelerate air flowing through the computer casing to thereby more effectively take heat away from a CPU in the computer system.

DESCRIPTION OF RELATED ART

Over the past few years, CPU speeds have been increasing at a dramatic rate. In order to more speedily processing information, CPUs have more transistors which consume more power and have higher clock rates. This leads to greater heat produced by the CPU in the computer. The heat can accumulate and generate unacceptable high temperature and thermal stress on the CPU, resulting in reliability performance degradation and system malfunction. Heat sinks have been added to all modern PC CPUs to help to dissipate some of the heat from the CPUs into the surrounding environment. A fan is generally mounted within the computer casing to accelerate air to flow through the heat sink mounted on the CPU in order to enhance heat dissipation capability of the heat sink.

The computer generally has a casing for accommodating and protecting components of the computer. The casing is generally a six-sided rectangular box comprising front and rear panels, top and bottom panels and two side panels. A motherboard is installed in the casing, parallel to the side panels. The CPU is mounted on the motherboard and various other electronic components are also mounted on the motherboard to cooperate with the CPU for achieving significant performance. Holes are defined in the front and rear panels of the casing, providing a passage so that cooling air outside the casing can enter the casing from the front panel to cool the CPU and the air heated by the CPU can be exhausted out of the casing through the holes defined in the rear panel. The fan is generally disposed in the passage to accelerate the speed of the air in traveling through the passage.

However, the airflow path is parallel to the motherboard. Such an airflow path brings a shortcoming that the hot air heated by the CPU must pass through the electronic components between the CPU and the rear panel before exiting the casing through the rear panel. As a result, the airflow is blocked to some extent by these electronic components. The hot air cannot be timely exhausted and is left within the casing too long. Temperature in the casing is thus increased. This is disadvantageous to cool the CPU.

What is needed, therefore, is a computer system which has an improved airflow path to accelerate air flowing through the computer casing.

SUMMARY OF INVENTION

A computer system in accordance with a preferred embodiment of the present invention comprises casing, a motherboard, a CPU mounted on the motherboard and a cooling device. The casing comprises a pair of parallel panels. Air inlets and air outlets are respectively defined in the parallel panels and oriented toward each other. The motherboard is parallelly positioned between the parallel panels. The cooling device has a base portion contacting the CPU, a heat dissipation portion defining a plurality of channels and located between the air inlets and the air outlets. The channels communicate with the air inlets and outlets. Two heat pipes are used to thermally connect the heat dissipation portion to the base portion. A fan is mounted between the air inlets and the heat dissipation portion and communicates the air inlets with the channels. A distance between the air inlets and the air outlets is substantially the same as the smallest one of the dimensions, e.g., the width, height and depth, of the casing.

Other advantages and novel features will become more apparent from the following detailed description of preferred embodiments when taken in conjunction with the accompanying drawings, in which:

DETAILED DESCRIPTION

Figure 1:
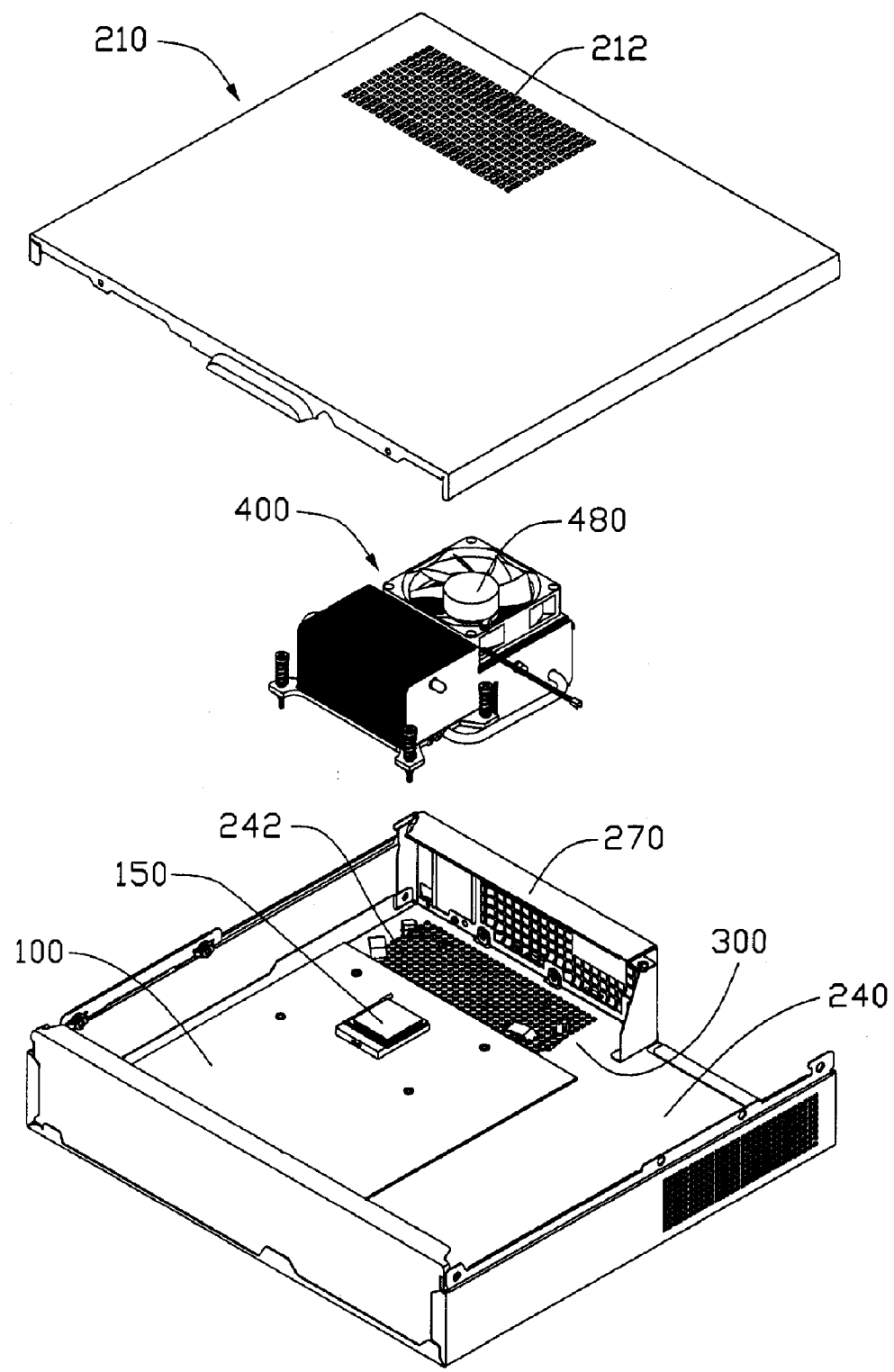
FIG. 1 is an exploded, isometric view of a computer system in accordance with a preferred embodiment of the present invention.

Referring to FIG. 1, a computer system of a preferred embodiment of the present invention comprises a computer casing (not labeled), a motherboard 100 installed with the casing, a CPU 150 mounted onto a side of the motherboard 100 and a cooling device 400 mounted to the motherboard 100 to cool the CPU 150.

The casing comprises first and second panels 210, 240 parallel to each other and a third panel 270 between the first and second panels 210, 240. A distance between the first and second panel 210, 240 constitutes a height of the casing. The third panel 270 perpendicularly connects the first and second panels 210, 240. The first panel 210 defines a plurality of air inlets 212 at a portion thereof adjacent to the third panel 270. The second panel 240 defines a plurality of air outlets 242 at a portion thereof adjacent to the third panel 270, and oriented toward and aligned with the air inlets 212. The casing has the height which is the shortest than the other two dimensions, i.e., the width and depth of the casing so that a distance between the air inlets 212 and the air outlets 242 is substantially equal to the shortest one of the dimensions of the casing. Thus, an airflow can most quickly pass through the casing by flowing from the air inlets 212 to the air outlets 242.

The motherboard 100 is oriented parallel to the first and second panels 210, 240 and positioned between the first and second panels 210, 240. A space 300 is defined between the motherboard 100, the third panel 270, the first panel 210 and the second panel 240. The space 300 communicates with the air inlets 212 and the air outlets 242. An airflow path extending through the air inlets 212, the space 300 and the air outlets 242 is thus formed to allow air to flow within the casing in a direction perpendicular to the motherboard 100. The CPU 150 is mounted to the motherboard 100 near the space 300.

Figure 2:
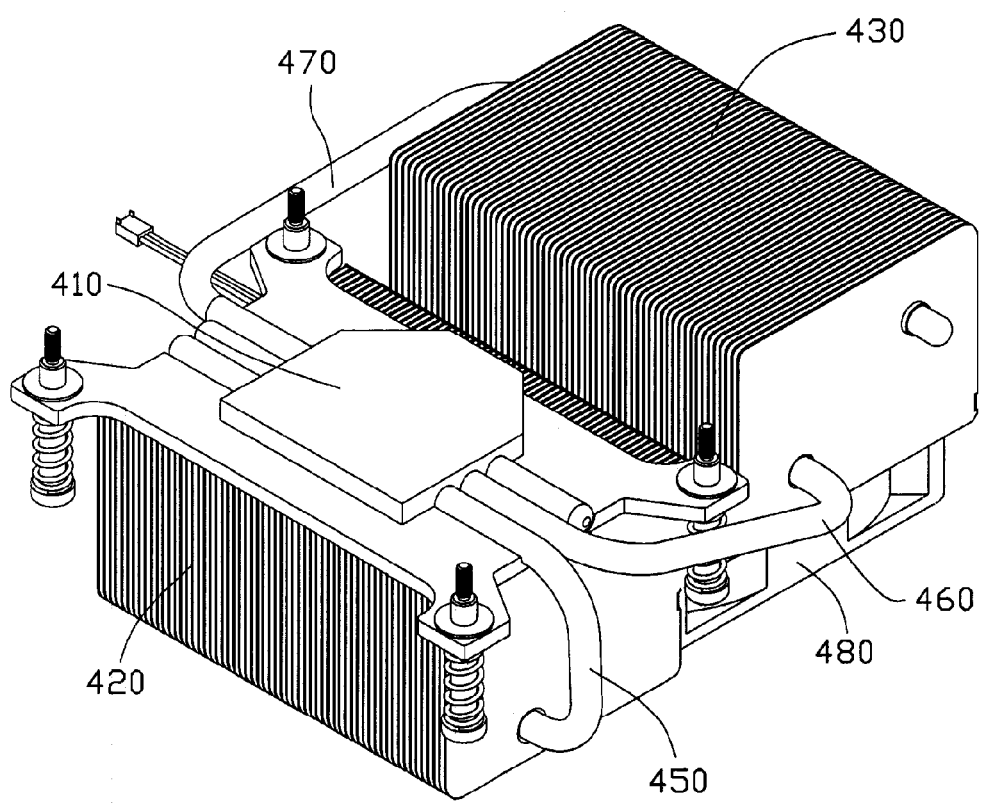
FIG. 2 is an enlarged view of a cooling device, but viewed in a different aspect from in FIG. 1.
Figure 3:
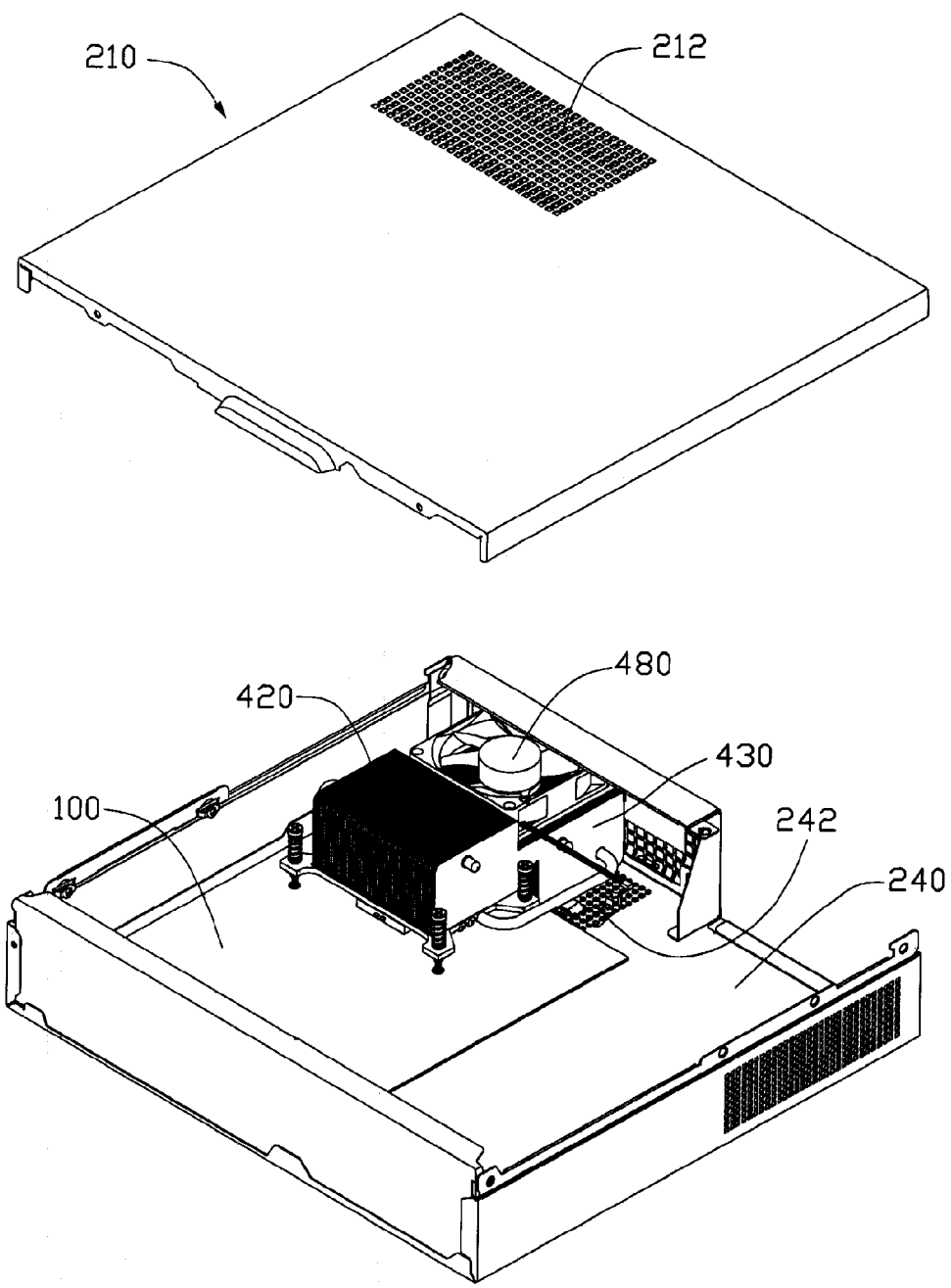
FIG. 3 is similar to FIG. 1, but the cooling device is mounted to a motherboard of the computer system.

Referring also to FIGS. 2-3, the cooling device 400 comprises a base portion 410, a first heat dissipation portion 420 and a second heat dissipation portion 430 integrally extending from the first heat dissipation portion 420, three U-shaped heat pipes 450, 460, 470, a fan 480. The base portion 410 is for contacting with the CPU 150 to absorb heat from the CPU 150. The first heat dissipation portion 420 is attached to the base portion 410 by soldering or by any other conventional means. The second heat dissipation portion 430 is disposed within the space 300 and extended in a direction across the motherboard 100. The second heat dissipation portion 430 extends from the first heat dissipation 420 through an edge (not labeled) of the motherboard 100 into the space 300. The fan 480 is mounted on the second heat dissipation portion 430 and communicates with the air inlets 212. A top surface of the fan 480 is not higher than a top surface of the first heat dissipation portion 420. The fan 480 is mounted in a recess (not labeled) in a top surface of the second heat dissipation portion 430, while the base 410 is mounted in a recess (not labeled) in a bottom surface of the first heat dissipation portion 420. The top surfaces of the fan 480 and the first heat dissipation portion 420 adjoin to the first panel 210. The second heat dissipation portion 430 defines a plurality of channels (not labeled) within the space 300 and communicating with the fan 480 and the air outlets 242 and the air inlets 212. Thus, the air inlets 212, the fan 480, the channels of the second heat dissipation portion 430 and the air outlets 242 are communicated together. The fan 480 and the second heat dissipation portion 430 are disposed in the airflow path from the air inlets 212 to the air outlets 242.

Each of the heat pipes 450, 460, 470 comprises an evaporating portion (not labeled) and a condensing portion (not labeled) parallel to the evaporating portion. The evaporating portions are positioned to the base portion 410 by soldering or by any other conventional means. The condensing portion of the heat pipe 450 is inserted through a top section of the first heat dissipation portion 420 to thermally connect the top section of the first heat dissipation portion 420 to the base portion 410. The condensing portions of the heat pipes 460, 470 are inserted through different sections of the second heat dissipation portion 430 respectively to thermally connect the second heat dissipation portion 430 to the base portion 410. Therefore, the heat on the base portion 410 can be quickly transferred to the top section of the first heat dissipation portion 420 and the second heat dissipation portion 430 for being dissipated to surrounding environment.

The CPU 150 generates heat during operation. The base portion 410 absorbs the heat generated by the CPU 150. The heat is then respectively transferred to a bottom section of the first heat dissipation portion 420 by means of conduction, the second heat dissipation portion 430 via the heat pipes 460, 470, and the top section of the first heat dissipation portion 420 via the heat pipe 450. The first heat dissipation portion 420 dissipates the heat thereon by natural convection. Cooling air is driven by the fan 480 to enter the casing from the air inlets 212. Then the cooling air is forced to flow through the second heat dissipation portion 430 to have a heat exchange therewith and leave the second heat dissipation 430 and the casing through the air outlets 242. Accordingly, the heat transferred to the second heat dissipation portion 430 by the heat pipes 460, 470 is taken away by the cooling air and dissipated to the atmosphere outside the casing.

Apparently, in the preferred embodiment, the heat pipes 460, 470 convey the heat from the base portion 100 near the CPU 150 to the second heat dissipation portion 430 which is remote from the CPU 150 relative to the base portion 100. Cooling air enters the casing from the air inlets 212 defined in the first panel 210 and exits the casing through the air outlets 242 defined in the second panel 240. The distance between the first and second panels 210, 240 is the shortest one of the dimensions of the casing and the air outlets 242 and the air inlets 212 are in alignment with each other. The airflow path extending through the air inlets 212 and the air outlets 242 is thus the shortest airflow path available to take heat away from the CPU 150. Thus, the air can quickly pass through the casing in the airflow path to take the heat thereaway. Additionally, in the airflow path for the cooling air, there is only the second heat dissipation portion 430 which exchanges heat with the cooling air. Thus, the number of the component located in the airflow path and obstructing the airflow is minimized. The fan 480 can enhance air pressure and accelerate airflow speed in the path so that the cooling air can quickly pass through the casing to take away the heat on the second heat dissipation portion 430.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A computer system, comprising:
a casing comprising a pair of parallel panels, air inlets and air outlets respectively being defined in the parallel panels, the air inlets oriented toward the air outlets;
a motherboard parallelly positioned between the parallel panels;
a CPU mounted on the motherboard; and
a cooling device having a base portion contacting the CPU, a heat dissipation portion defining a plurality of channels communicating with the air outlets, at least one heat pipe thermally connecting the heat dissipation portion to the base portion, a fan communicating with the air inlets and the channels, an additional heat dissipation portion attached to the base portion, and an additional heat pipe thermally connecting a top section of the additional heat dissipation portion to the base portion.

2. The computer system as claimed in claim 1, wherein the casing further comprises an additional panel perpendicular to and between the parallel panels.

3. The computer system as claimed in claim 2, wherein the heat dissipation portion is disposed between the motherboard and the additional panel.

4. The computer system as claimed in claim 1, wherein the heat dissipation portion extends in a direction across the motherboard.

5. The computer system as claimed in claim 1, wherein the additional heat pipe is inserted through the top section of the additional heat dissipation portion.

6. The computer system as claimed in claim 1, wherein the additional heat dissipation portion and the fan adjoin to one of the parallel panels.

7. A computer system, comprising:
a casing defining aligned air inlets and air outlets at opposite sides thereof, an airflow path extending through the air inlets and the air outlets;
a motherboard positioned within the casing;
a CPU mounted on the motherboard; and
a cooling device comprising a base portion contacting the CPU, a heat dissipation portion, at least one heat pipe thermally connecting the heat dissipation portion to the base portion, and a fan;
wherein the airflow path is perpendicular to the motherboard, the heat dissipation portion and the fan are disposed in the airflow path from the air inlets to the air outlets.

8. The computer system as claimed in claim 7, wherein the cooling device further comprises an additional heat dissipation portion attached on the base portion.

9. The computer system as claimed in claim 8, wherein the cooling device comprises an additional heat pipe thermally connecting the additional heat dissipation portion to the base portion.

10. The computer system as claimed in claim 7, wherein the at least one heat pipe is U-shaped.

11. A computer system comprising:
a casing having two opposite first wall and second wall, the first wall defining an air inlet and the second wall defining an air outlet, an airflow path being defined between the air inlet and the air outlet;
a circuit board located in the casing at a position spaced from the airflow path;
a heat-generating electronic component mounted on the circuit board;
a heat dissipation device having a first portion in thermal contacting with the heat-generating electronic component and a second portion extending through an edge of the circuit board into the airflow path.

12. The computer system of claim 11, wherein the airflow path has a length which is substantially the same as one of dimensions of the casing wherein the one of the dimensions is the shortest than the other dimensions.

13. The computer system of claim 12 further comprising a fan mounted on the second portion, and wherein the circuit board is oriented parallel to the first and second walls.

14. The computer system of claim 11 further comprising a heat pipe thermally connecting the first portion and the second portion.

15. The computer system of claim 11 further comprising a fan mounted on the second portion of the heat dissipation device and located between the second portion and the air inlet.

16. The computer system of claim 15, wherein the first portion of the heat dissipation device comprises a base, a first heat dissipation portion and a heat pipe thermally connecting the base and the first heat dissipation portion, the base thermally contacting with the heat-generating electronic component.

17. The computer system of claim 11, wherein the second portion defines a recess, a fan being received in the recess and located between the second portion and the air inlet, and the first portion defining a recess, a base being received in the recess of the first portion and thermally contacting with the heat-generating electronic component.

18. The computer system of claim 17, wherein the recess of the first portion is defined in a bottom surface thereof, and the recess of the second portion is defined in a top surface thereof.

* * * * *